(12) United States Patent
Lai et al.

(10) Patent No.: US 9,929,210 B2
(45) Date of Patent: Mar. 27, 2018

(54) SPIN-ORBIT TORQUE MAGNETIC RANDOM ACCESS MEMORY

(71) Applicant: National Tsing Hua University, Hsinchu (TW)

(72) Inventors: Chih-Huang Lai, Hsinchu (TW); Ming-Han Tsai, Hsinchu (TW); Kuo-Feng Huang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/435,547

(22) Filed: Feb. 17, 2017

(65) Prior Publication Data
US 2017/0301727 A1 Oct. 19, 2017

(30) Foreign Application Priority Data

Apr. 19, 2016 (TW) .............................. 105112079 A

(51) Int. Cl.
| | |
|---|---|
| *G11C 11/16* | (2006.01) |
| *G11C 11/18* | (2006.01) |
| *H01L 43/08* | (2006.01) |
| *H01L 43/02* | (2006.01) |
| *H01L 43/04* | (2006.01) |
| *H01L 27/22* | (2006.01) |
| *H01L 43/10* | (2006.01) |
| *H01L 43/06* | (2006.01) |

(52) U.S. Cl.
CPC .......... *H01L 27/222* (2013.01); *G11C 11/161* (2013.01); *G11C 11/18* (2013.01); *H01L 43/04* (2013.01); *H01L 43/10* (2013.01); *H01L 43/06* (2013.01); *H01L 43/08* (2013.01)

(58) Field of Classification Search
CPC .................................................... G11C 11/161
See application file for complete search history.

(56) References Cited

U.S. PATENT DOCUMENTS 9,379,316 B2 * 6/2016 Lai .................. H01L 27/228
9,830,966 B2 * 11/2017 Mihajlovic ........... G11C 11/161

OTHER PUBLICATIONS

A. van den Brink et al., "Field-free magnetization reversal by spin-Hall effect and exchange bias", Nature Communications 7, 2016, 6 pages.

\* cited by examiner

*Primary Examiner* — Victor A Mandala
*Assistant Examiner* — Regan J Rundio
(74) *Attorney, Agent, or Firm* — Birch, Stewart, Kolasch & Birch, LLP

(57) ABSTRACT

A spin-orbit torque magnetic random access memory includes a substrate, and an SOT memory cell disposed on the substrate and including a magnetic free layer including a ferromagnetic first metal layer, an anti-ferromagnetic second metal layer, and a third metal layer for generating spin-Hall effect. The first metal layer has a thickness ranging from 0.5 nm to 1.5 nm and exhibits perpendicular magnetic anisotropy (PMA). The second metal layer has a thickness greater than 6 nm for providing an exchange bias field. The second metal layer is an IrMn layer not undergone out-of-plane magnetic annealing or coating and exhibiting no PMA. The magnetic free layer has a coercive magnetic field ($H_c$) upon reaching the critical current density, and $|H_{EB}|>|H_c|$.

6 Claims, 17 Drawing Sheets

SPIN-ORBIT TORQUE MAGNETIC RANDOM ACCESS MEMORY

CROSS-REFERENCE TO RELATED APPLICATION

This application claims priority of Taiwanese Patent Application No. 105112079, filed on Apr. 19, 2016.

FIELD

The disclosure relates to a random access memory (RAM), more particularly to a spin-orbit torque magnetic random access memory (SOT-MRAM).

BACKGROUND

Due to the discovery of tunneling magnetoresistance (TMR), Magnetic Random Access Memories (MRAMs) composed of a magnetic free layer, an insulating barrier layer and a ferromagnetic pin layer have come into play in recent years and are deemed as a promising next generation memory technology. Such MRAMs have their logic levels, e.g., 0 and 1, determined by manipulating magnetic moments of the free layer via electron spinning under applied currents and external magnetic fields, such that the resistance of memory cells can be altered accordingly. Among conventional MRAMs, spin-orbit torque magnetic random access memories (SOT-MRAMs), which adopt the so-called three terminal configuration for signal transmission, have drawn much attention owing to their ability to prevent reliability issues, such as time-dependent dielectric breakdown caused by the writing voltages (current) applied through their insulating barrier layers.

However, the major problem of such conventional SOT-MRAMs resides in that an external magnetic field is required when writing the SOT memory cells thereof. As such, the necessity of having devices to provide the external magnetic field when using the conventional SOT-MRAMs significantly delays the commercialization process of the same.

It is worth noting that skilled artisans tend to reduce the size of memory cells for increasing the areal density of the same. As such, the ferromagnetic material used in the memory cells with reduced size is required to have a sufficient amount of magnetic anisotropy energy for thermal stability. However, one skilled in the art may appreciate that when the size of the ferromagnetic material is reduced to a certain level, superparamagnetism may be incurred due to external thermal fluctuation which adversely affects the thermal stability.

SUMMARY

A spin-orbit torque magnetic random access memory (SOT-MRAM) includes a substrate and an SOT memory cell. The SOT memory cell is disposed on the substrate and includes a magnetic free layer. The magnetic free layer includes a ferromagnetic first metal layer, an anti-ferromagnetic second metal layer contacting the first metal layer, and a third metal layer contacting the first metal layer for generating the spin-Hall effect. The first metal layer has a thickness ranging from 0.5 nm to 1.5 nm and exhibits perpendicular magnetic anisotropy.

The second metal layer has a thickness of greater than 6 nm for providing an exchange bias field ($H_{EB}$) upon an external magnetic field and an electric pulse, which are provided along a hard axis of the first metal layer, reaching a critical current density. The second metal layer is an IrMn layer which is not undergone out-of-plane magnetic annealing or out-of-plane magnetic coating and exhibits no perpendicular magnetic anisotropy. The magnetic free layer has a coercive magnetic field ($H_c$) upon reaching the critical current density, and $|H_{EB}|>|H_c|$.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
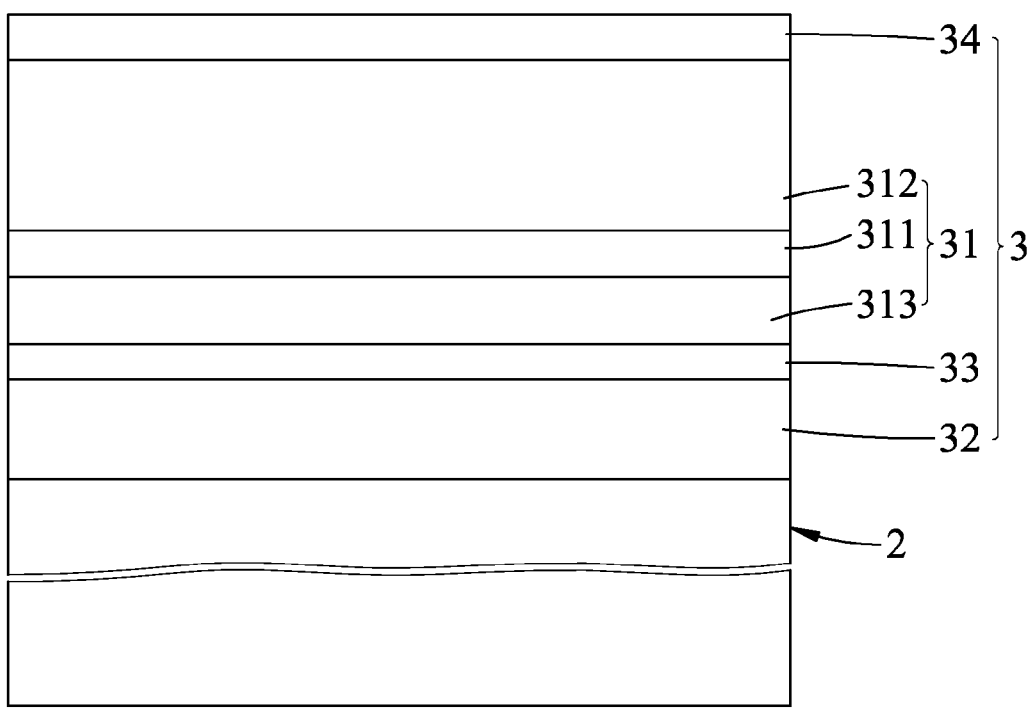
FIG. 1 is a schematic front view illustrating one embodiment of an SOT-MRAM according to the present disclosure.

Referring to FIG. 1, one embodiment of a spin-orbit torque magnetic random access memory (SOT-MRAM) according to the present disclosure includes a substrate 2, and an SOT memory cell 3 disposed thereon.

In certain embodiments, the SOT memory cell 3 includes a magnetic free layer 31 disposed on the substrate 2, a magnetic pin layer 32 disposed on the substrate 2, an insulating barrier layer 33 interposed between the magnetic free layer 31 and the magnetic pin layer 32, and a Ta capping layer 34 disposed to cover the magnetic free layer 31. In such embodiments, the magnetic free layer 31 may include a ferromagnetic first metal layer 311, an anti-ferromagnetic second metal layer 312 contacting the first metal layer 311, and a third metal layer 313 contacting the first metal layer 311 for generating the spin-Hall effect. The third metal layer 313 may be formed on the insulating barrier layer 33, and the first metal layer 311 may be interposed between the second metal layer 312 and the third metal layer 313 as illustrated in FIG. 1.

Figure 2:
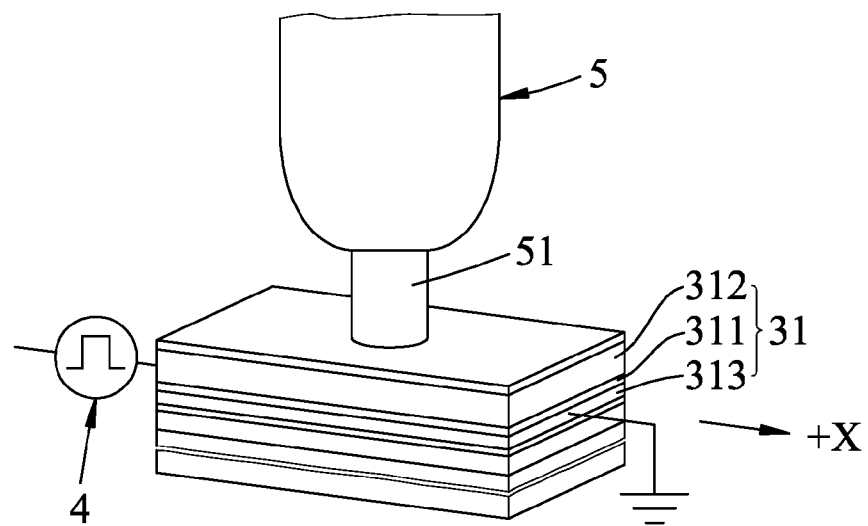
FIG. 2 is a schematic view of one embodiment, illustrating the writing process of the SOT-MRAM.
Figure 3:
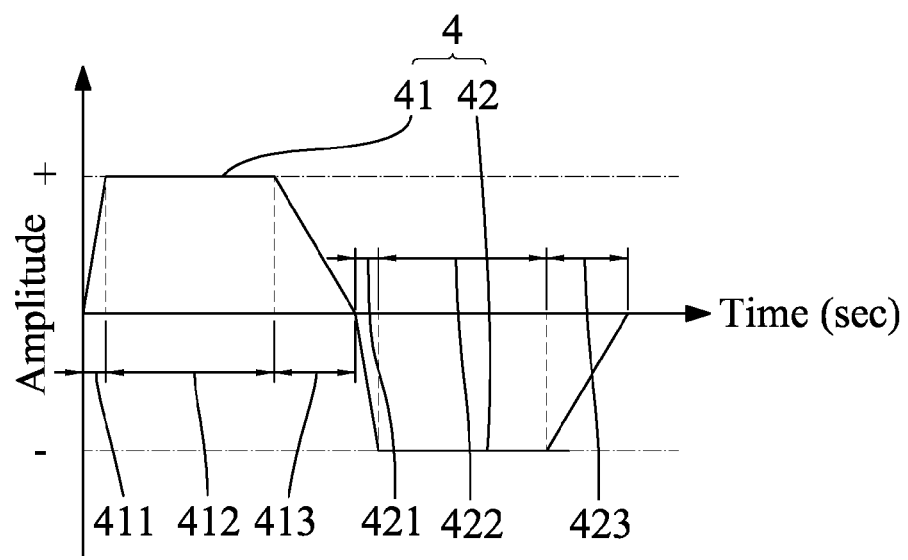
FIG. 3 is a plot illustrating an electric pulse used in the writing process of FIG. 2.

In certain embodiments, the first metal layer 311 has a thickness ($d_1$) ranging from 0.5 nm to 1.5 nm and exhibits perpendicular magnetic anisotropy (PMA). The second metal layer 312 may have a thickness ($d_2$) of greater than 6 nm for providing an exchange bias field ($H_{EB}$). As illustrated in FIG. 2, the exchange bias field ($H_{EB}$) is provided upon an external magnetic field and an electric pulse 4 being provided along a hard axis of the first metal layer 311 reaching a critical current density ($J_c$). It is worth noting that, in certain embodiments, the first metal layer 311 may exhibit perpendicular magnetic anisotropy and the hard axis thereof may extend along an in-plane direction (+X) as shown in FIG. 2. In other words, when writing the SOT memory cell 3 of the present disclosure, the electric pulse 4 and the in-plane external magnetic field are simultaneously provided along the hard axis of the first metal layer 311. As illustrated in FIG. 3, the electric pulse 4 may be positive or negative in the in-plane direction (+X), e.g., a positive pulse 41 with a rise time 411, a duration time 412 and a fall time 413, or a negative pulse 42 having a rise time 421, a duration time 422 and a fall time 423. In certain embodiments, the rise time 411, 421 of the positive or negative electric pulse 41, 42 may be 8.3 ns, the duration time 412, 422 may be 10 μs, and the fall time 413, 423 may be 1 μs.

In certain embodiments, the second metal layer 312 is an IrMn layer having an alloy ratio of, e.g., $Ir_{20}Mn_{80}$, which is not undergone out-of-plane magnetic annealing or out-of-plane magnetic coating and exhibits no perpendicular magnetic anisotropy. The magnetic free layer 31 exhibits a coercive field ($H_c$) when reaching the critical current density ($J_c$), where $|H_{EB}|>|H_c|$. It is found that once the second metal layer 312 has sufficient thickness, such as greater than 6 nm, there is no need to perform magnetic annealing or magnetic coating for the second metal layer 312 to exhibit anti-ferromagnetic properties. Here, the coercive field is referred to as the magnetic field needed to reverse the magnetization of the magnetic free layer 31 to zero after the electric pulse 4 provided to the magnetic free layer 31 is removed.

Referring to FIGS. 2 and 3, upon being applied with the electric pulse 4 (in either positive or negative direction), the third metal layer 313 generates a self-spin current via the spin-Hall effect, which provides angular momentums in the first metal layer 311. By such, when the critical current density ($J_c$) is reached, the self-spin current together with its angular momentums construct a magnetic field to effectively reverse the magnetic moments of the first metal layer 311, e.g., from positive magnetization to negative magnetization or from negative magnetization to positive magnetization. In addition, the uncompensated self-spin electrons at the interface between the first and second metal layers 311, 312 are aligned in the out-of-plane direction by said magnetic field, so that the exchange bias field ($H_{EB}$) at the interface is in the out-of-plane direction.

In certain embodiments, the thickness ($d_1$) is greater than or equal to 0.8 nm and less than 1.2 nm, and the thickness ($d_2$) is greater than or equal to 8 nm and less than 15 nm.

In certain embodiments, the first metal layer 311 includes a first metal selected from the group consisting of Co, Fe, Ni, and combinations thereof. In certain embodiments, the third metal layer 313 includes a second metal, or a third metal which is doped with a fourth metal. The second metal may be selected from the group consisting of Pd, Pt, Ta, Mo, W, and combinations thereof. The third metal maybe selected from the group consisting of Cu, Pt, W and combinations thereof. The fourth metal may be selected from the group consisting of Ir, Pt, W, Bi and combinations thereof. In certain embodiments, the first metal layer 311 may further include B. For instance, the first metal layer 311 may be constituted by CoFeB.

In certain embodiments, the first metal layer 311 is made of Co, and the third metal layer 313 is made of Pt.

In certain embodiments, the first metal layer 311 has a thickness ($d_3$) which is greater than or equal to 1.5 nm, and less than or equal to 8 nm. In such embodiments, the thickness ($d_3$) may be greater than or equal to 1.5 nm, and less than or equal to 3.0 nm.

It should be noted that, one skilled in the art may readily appreciate that the magnetic free layer 31 plays a key role in the SOT memory cell 3 as a major component for recording the logic states thereof. Thus, the following examples, as well as the comparative examples, will be described in further detail with respect to magnetization (or Kerr Intensity) of the magnetic free layer 31 instead of describing resistance states of the SOT memory cell 3.

EXAMPLE 1 (E1)

A 2.5 nm-thick Ta layer was first deposited onto a thermally-oxidized Si (100) wafer by DC magnetron sputtering, followed by subsequently depositing a lower Pt layer (i.e., the third metal layer 313), a Co layer (i.e., the first metal layer 311), an $Ir_{20}Mn_{80}$ alloy layer (i.e., the second metal layer 312), an upper Pt layer, and a Ta capping layer, so as to form a multilayered structure, wherein the lower Pt layer has a thickness of 2 nm, the Co layer has a thickness of 1.17 nm, the $Ir_{20}Mn_{80}$ layer has a thickness of 8.0 nm and the upper Pt layer has a thickness of 4 nm, and the Ta capping layer has a thickness of 2.5 nm. Thereafter, the multilayered structure was patterned into 5 μm×10 μm Hall-crosses by photolithography and reactive-ion etching, and a 10 nm-thick layer of Ta and a 100 nm-thick of Pt were further fabricated on the multilayered structure as a top electrode by photolithography, DC magnetron sputtering, and lift-off process, so as to obtain the magnetic free layer 31 of Example 1. The overall structure of E1 on the silicon substrate in a bottom-up direction is Ta(2.5 nm)/Pt(2 nm)/Co(1.17 nm)/$Ir_{20}Mn_{80}$ (8 nm)/Pt (4 nm)/Ta (2.5 nm)/Ta (10 nm)/Pt (100 nm), where the magnetic free layer 31 of E1 has the structure of Pt(2 nm)/Co(1.17 nm)/$Ir_{20}Mn_{80}$(8 nm).

Figure 7:
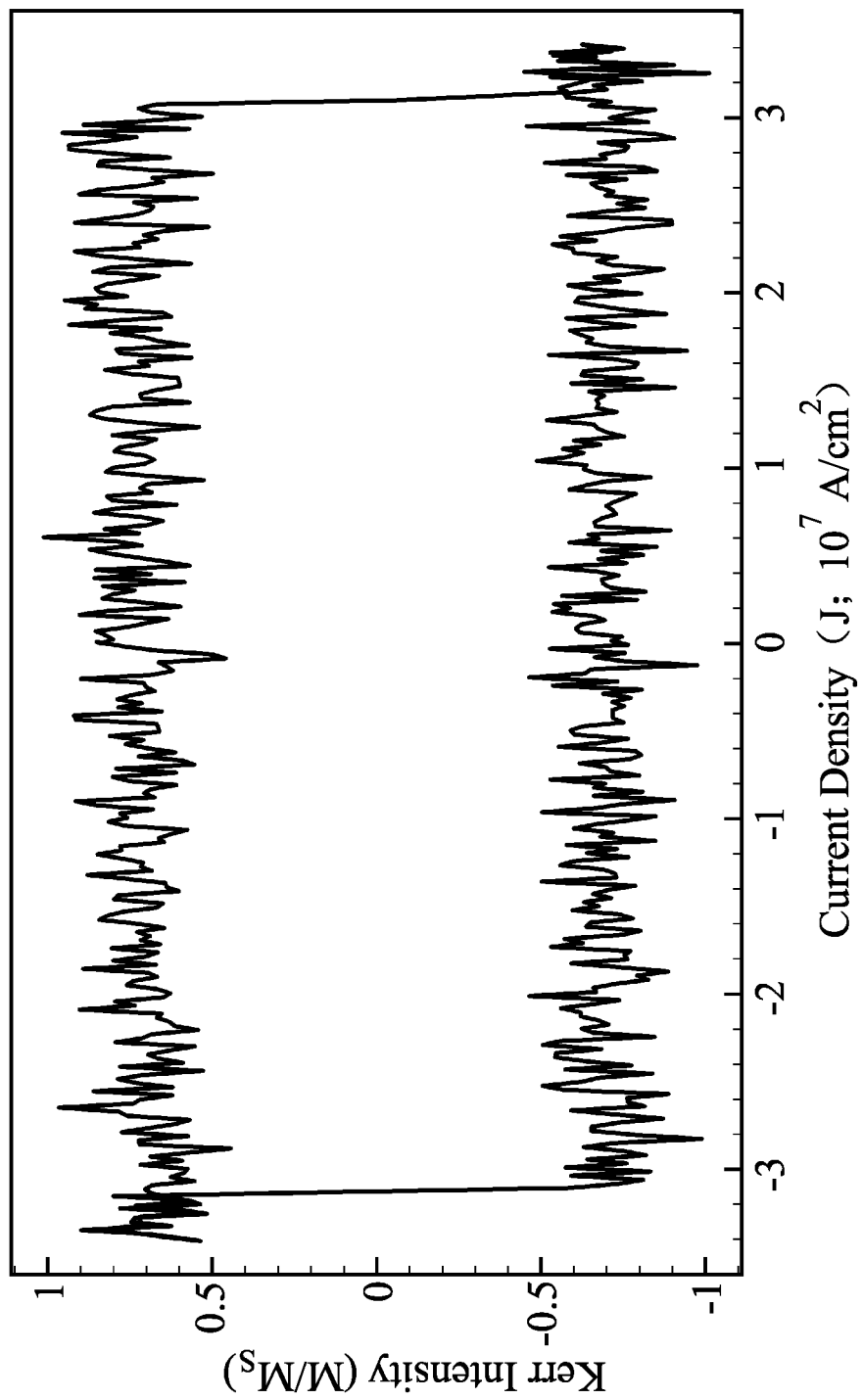
FIG. 7 is a graph illustrating the relationship between the Kerr Intensity and the current density for Example 1.
Figure 8:
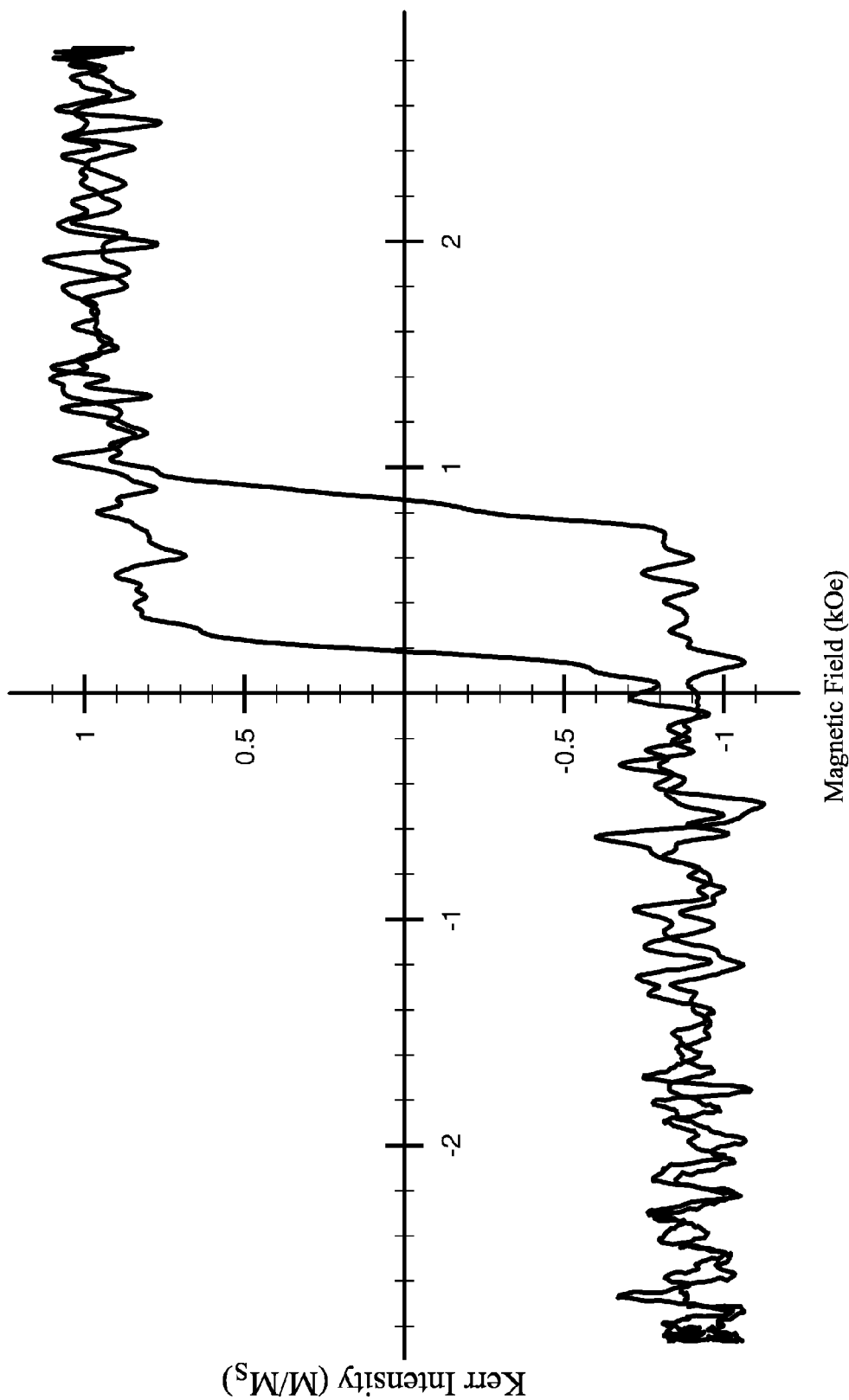
FIG. 8 is an out-of-plane hysteresis loop diagram of Example 1 when the electric pulse is in a positive direction.
Figure 9:
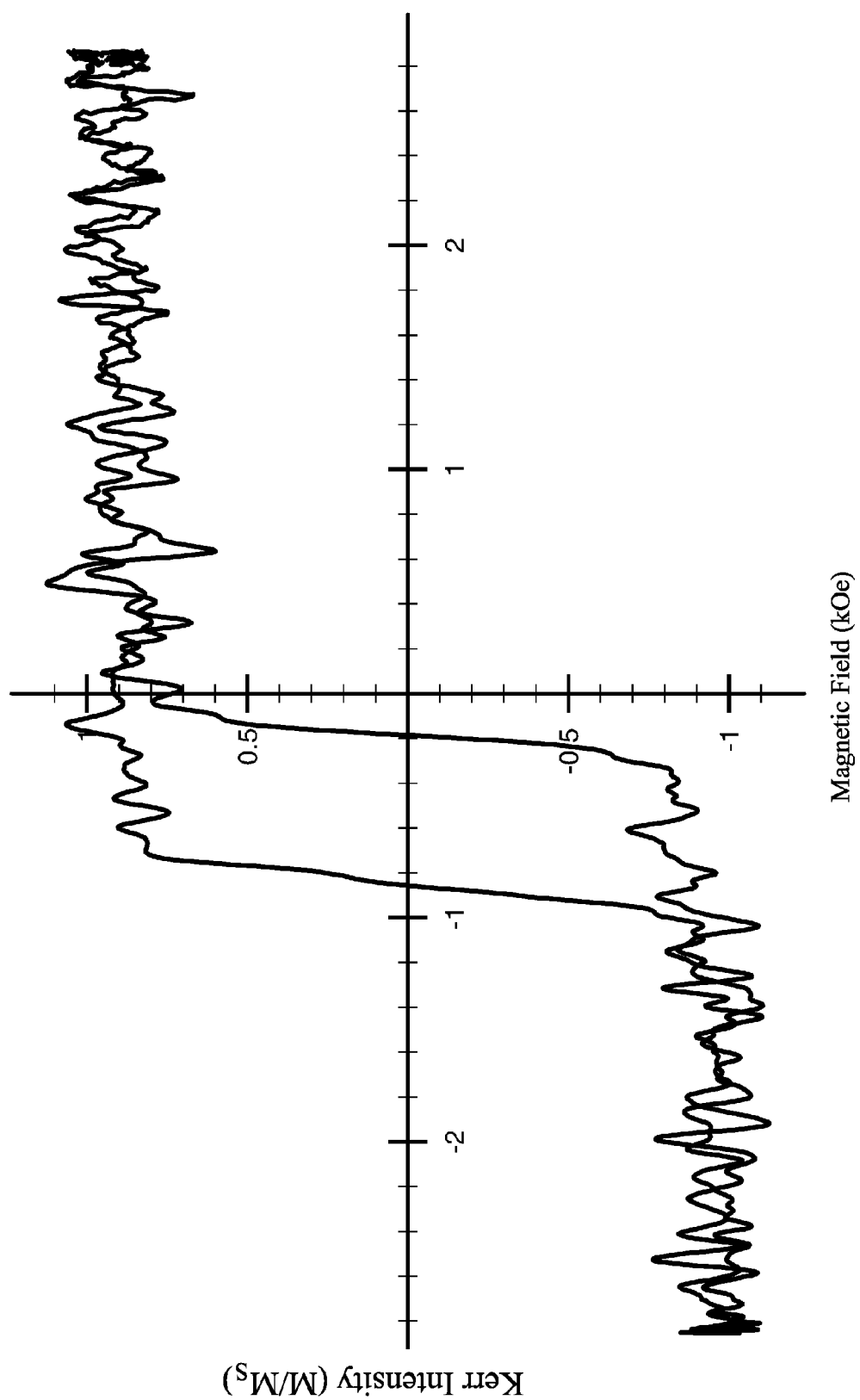
FIG. 9 is an out-of-plane hysteresis loop diagram of Example 1 when the electric pulse is in a negative direction.

The magnetic properties of the multilayered structure of Example 1 when writing the same was monitored by a focused polar magneto-optical Kerr effect (FMOKE) system 5 (see FIG. 2) under a laser spot 51 with a diameter of 5 μm. An electric pulse 4 with adjustable rise, duration and fall times was provided by an arbitrary waveform generator (Keysight 33509B) and was monitored by an oscilloscope (Tektronix DP05104B). The resulting current density was calculated from the applied voltage, the sample resistance, the cross-sectional area of the wires in the Hall crosses and the current shunting of the under/capping Ta layers. The result of Example 1 is shown in FIGS. 7 to 9.

EXAMPLE 2 (E2)

The SOT memory cell 3 of Example 2 is similar to that of Example 1, but differs in the thickness of the $Ir_{20}Mn_{80}$ layer, i.e., the second metal layer 312. In other words, the overall structure of the SOT memory cell 3 of E2 in the bottom-up direction is Ta (2.5 nm)/Pt (2 nm)/Co (1.17 nm)/$Ir_{20}Mn_{80}$ (10 nm)/Pt (4 nm)/Ta (2.5 nm), wherein the magnetic free layer 31 of E2 has the structure of Pt (2 nm)/Co (1.17 nm)/$Ir_{20}Mn_{80}$ (10 nm). The result of Example 2 is shown in FIGS. 10 to 13.

EXAMPLE 3 (E3)

Figure 16:
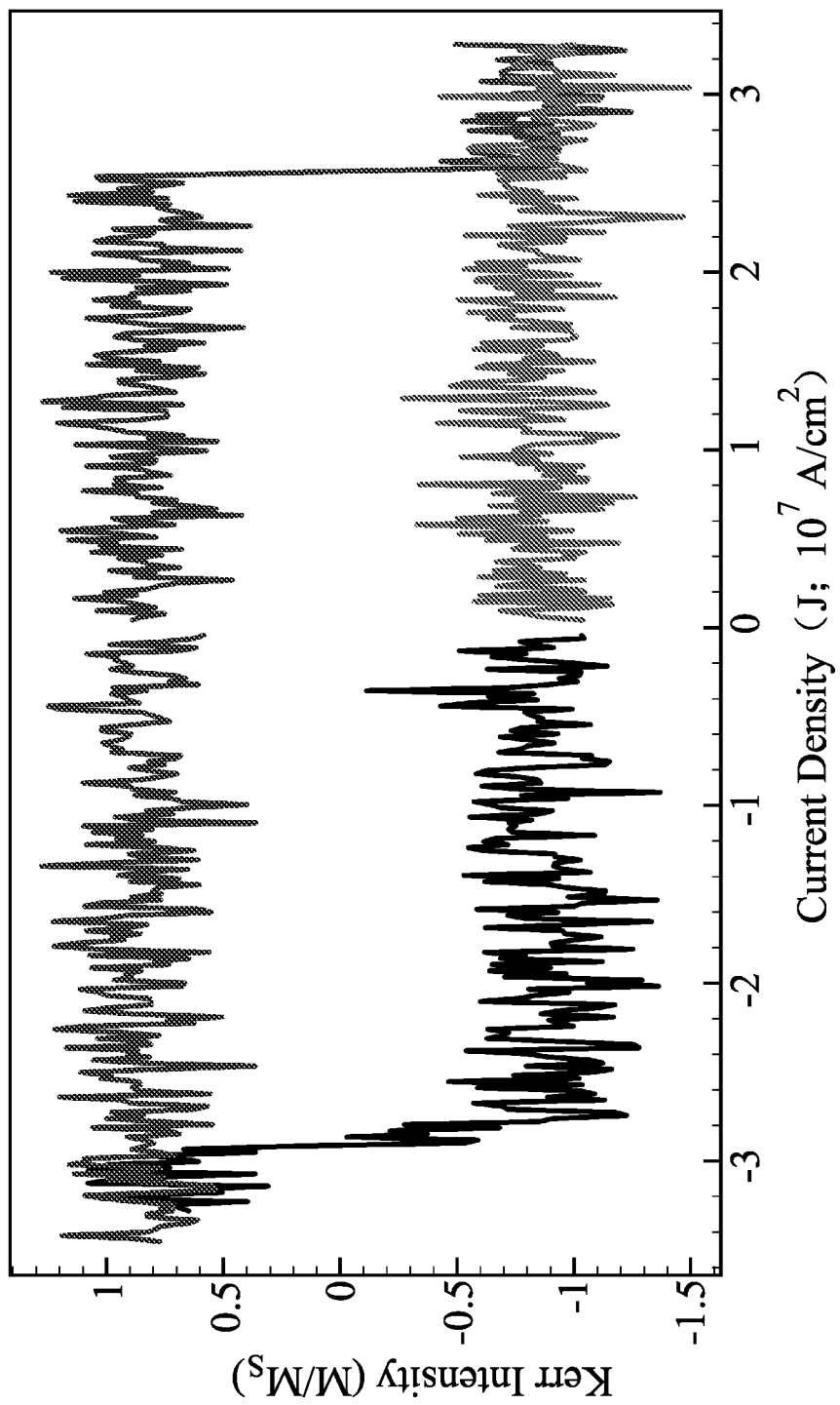
FIG. 16 a graph illustrating the relationship between the Kerr Intensity and the current density for Example 3.
Figure 17:
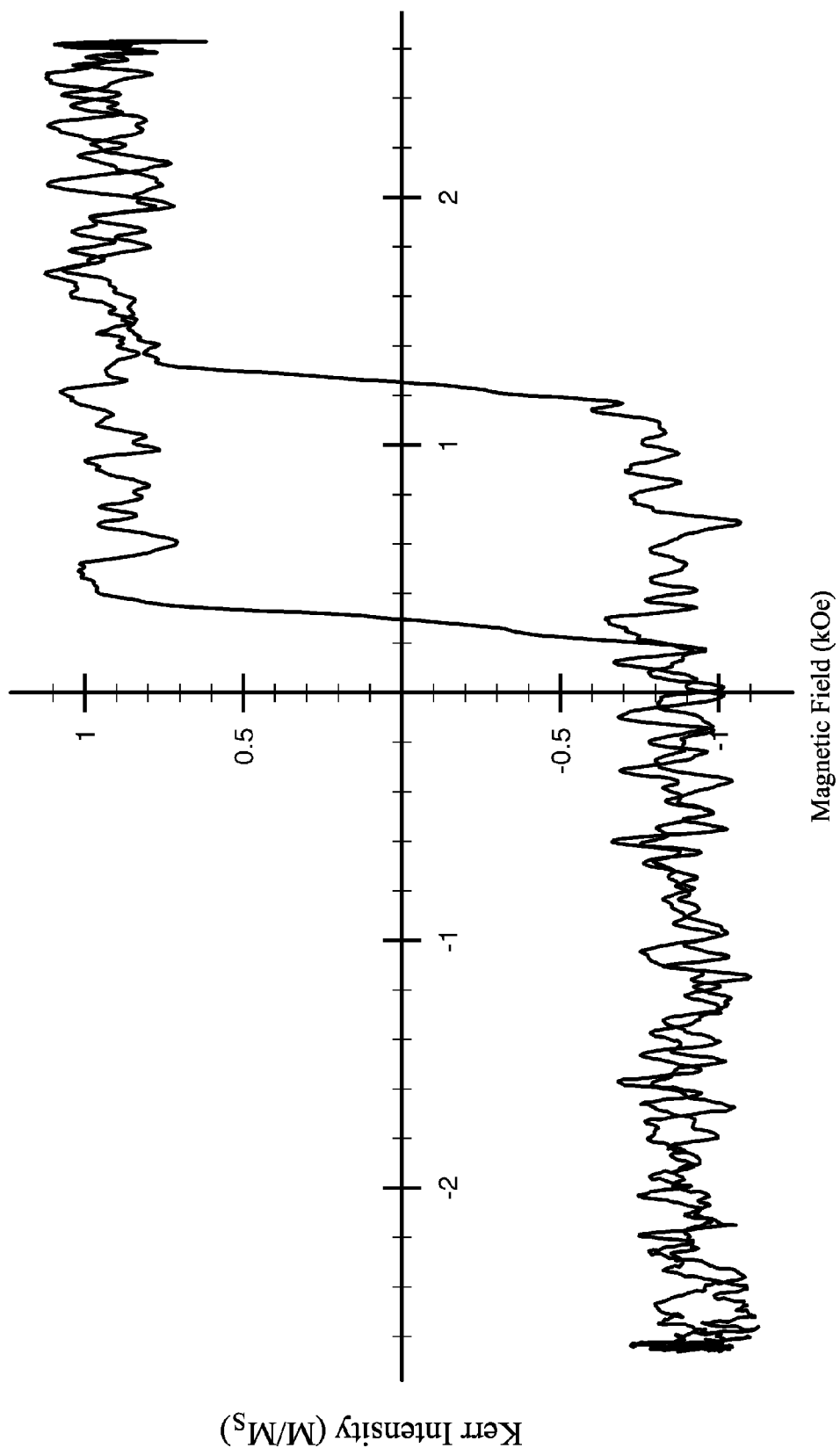
FIG. 17 is an out-of-plane hysteresis loop diagram of Example 3 when the electric pulse is in a positive direction.
Figure 18:
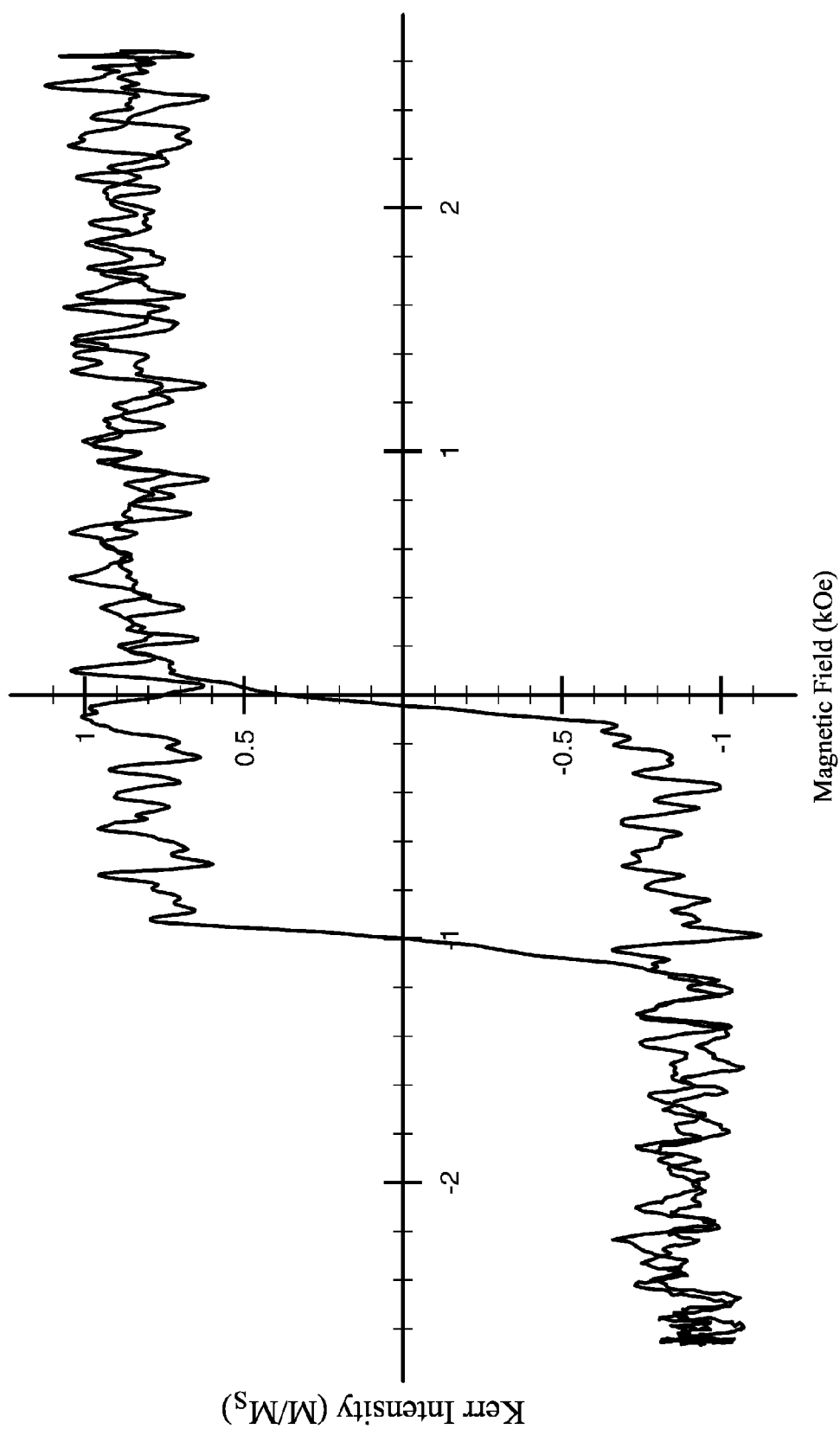
FIG. 18 is an out-of-plane hysteresis loop diagram of Comparative Example 2 when the electric pulse is in a negative direction.

The SOT memory cell 3 of Example 3 is similar to that of Example 1, but differs in the thickness of the Co layer, i.e., the first metal layer 311. In other words, the overall structure of the SOT memory cell 3 of E3 in the bottom-up direction is Ta(2.5 nm)/Pt(2 nm)/Co(0.88 nm)/$Ir_{20}Mn_{80}$(8 nm)/Pt(4 nm)/Ta(2.5 nm), where the magnetic free layer 31 of E2 has the structure of Pt(2 nm)/Co(0.88 nm)/$Ir_{20}Mn_{80}$(8 nm). The result of Example 3 is shown in FIGS. 16 to 18.

COMPARATIVE EXAMPLE 1 (CE1)

Figure 4:
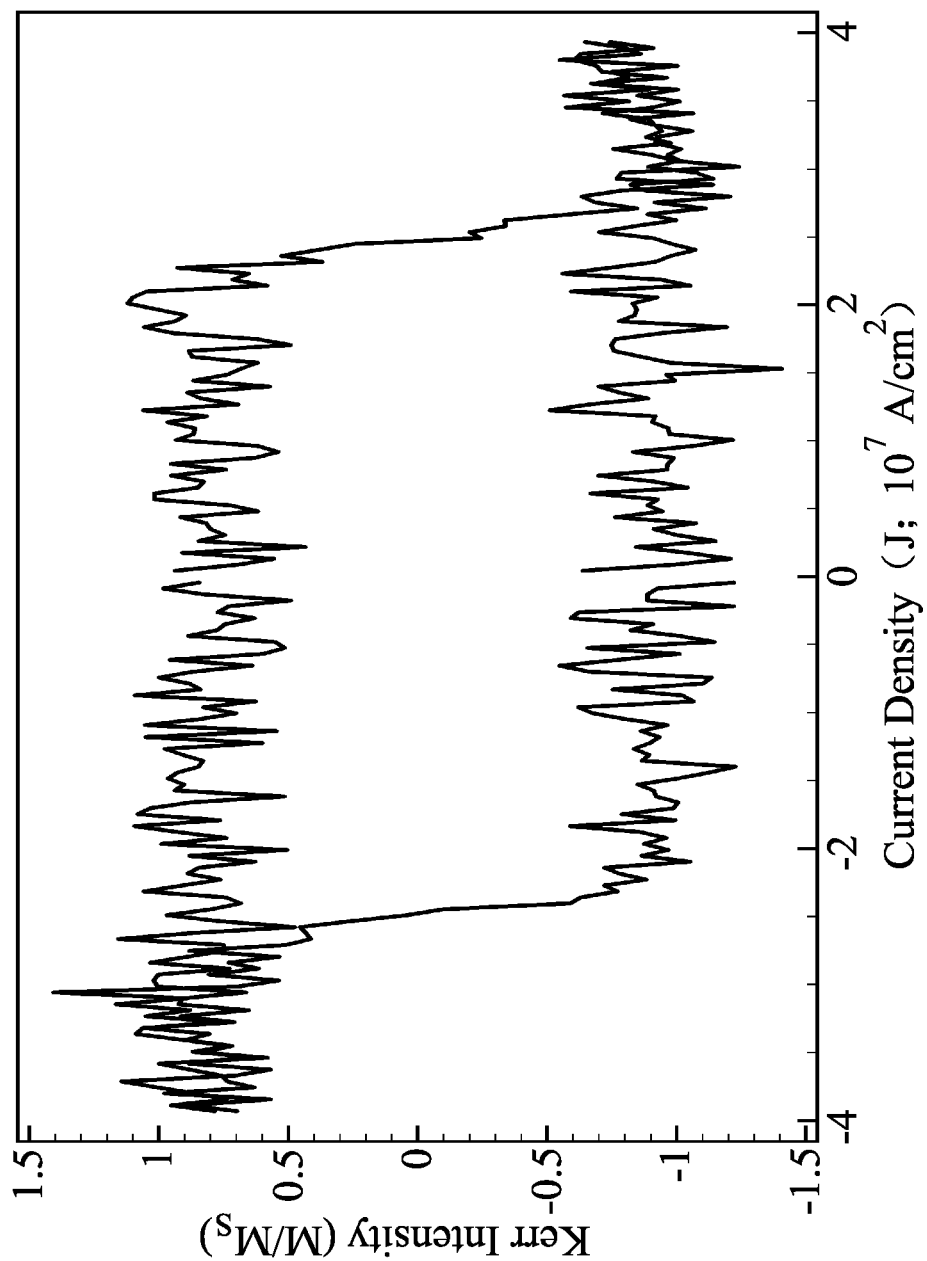
FIG. 4 is a graph illustrating the relationship between the Kerr Intensity (i.e., the normalized magnetization ($M/M_s$), which equals to the magnetization of a material divided by its saturation magnetization) and the current density for Comparative Example 1.
Figure 5:
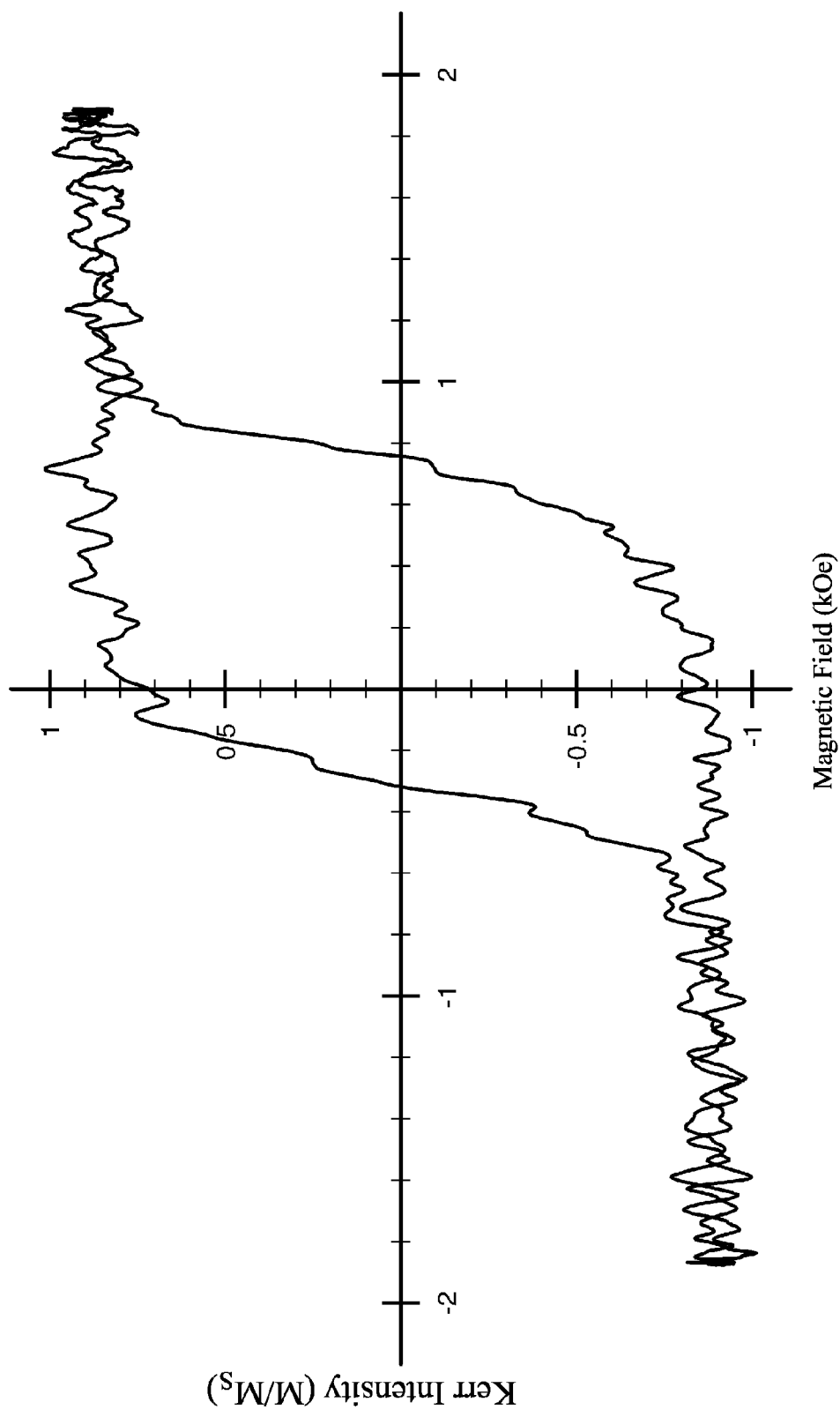
FIG. 5 is an out-of-plane hysteresis loop diagram of Comparative Example 1 when the electric pulse is in a positive direction.
Figure 6:
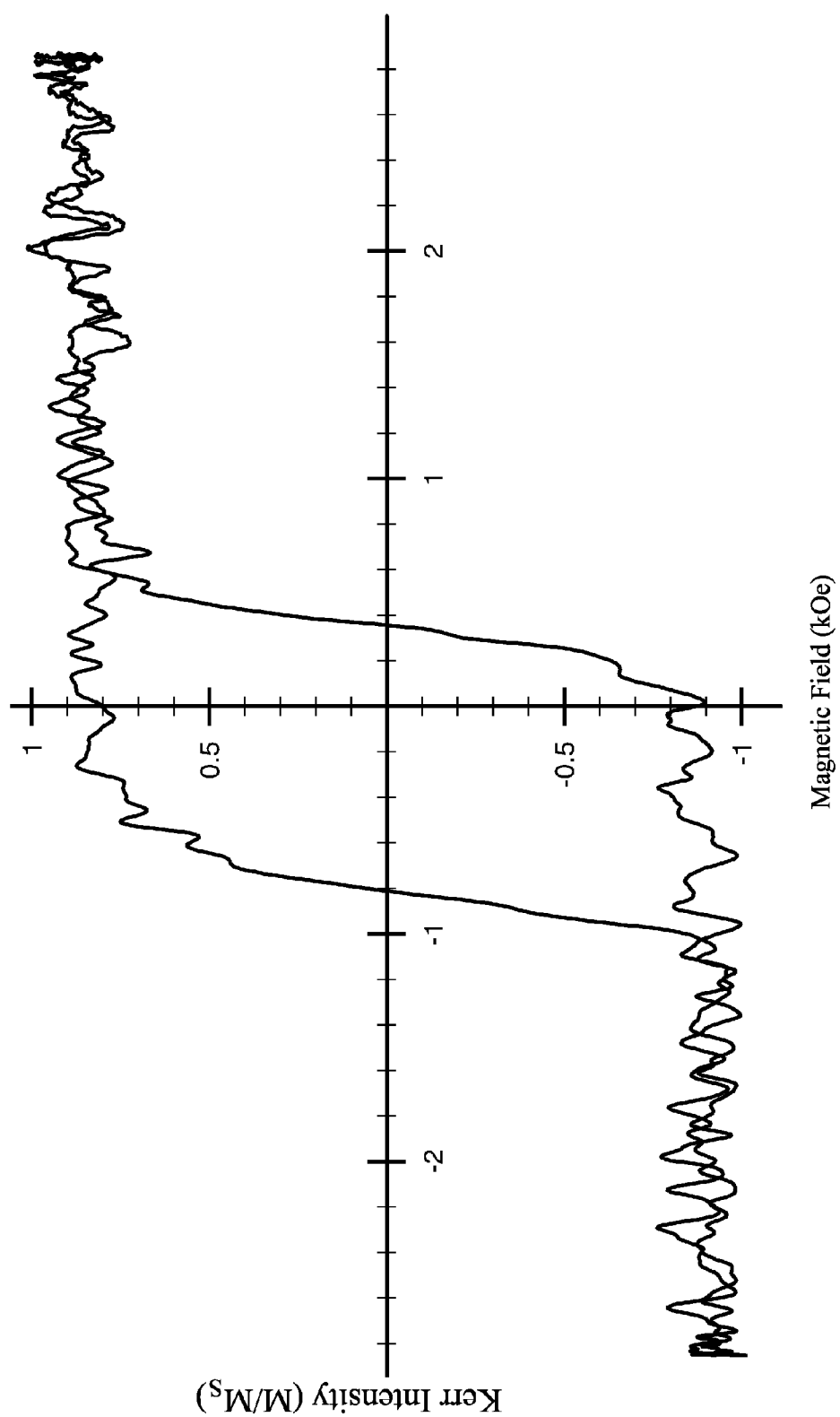
FIG. 6 is an out-of-plane hysteresis loop diagram of Comparative Example 1 when the electric pulse is in a negative direction.

The SOT memory cell 3 of Comparative Example 1 is similar to that of Example 1, but differs in the thickness of the $Ir_{20}Mn_{80}$ layer, i.e., the second metal layer 312. In other words, the overall structure of the SOT memory cell 3 of CE1 in the bottom-up direction is Ta(2.5 nm)/Pt(2 nm)/Co (1.17 nm)/$Ir_{20}Mn_{80}$(6 nm)/Pt(4 nm)/Ta(2.5 nm), where the magnetic free layer 31 of E2 has the structure of Pt(2 nm)/Co(1.17 nm)/$Ir_{20}Mn_{80}$(6 nm). The result of Comparative Example 1 is shown in FIGS. 4 to 6.

COMPARATIVE EXAMPLE 2 (CE2)

Figure 14:
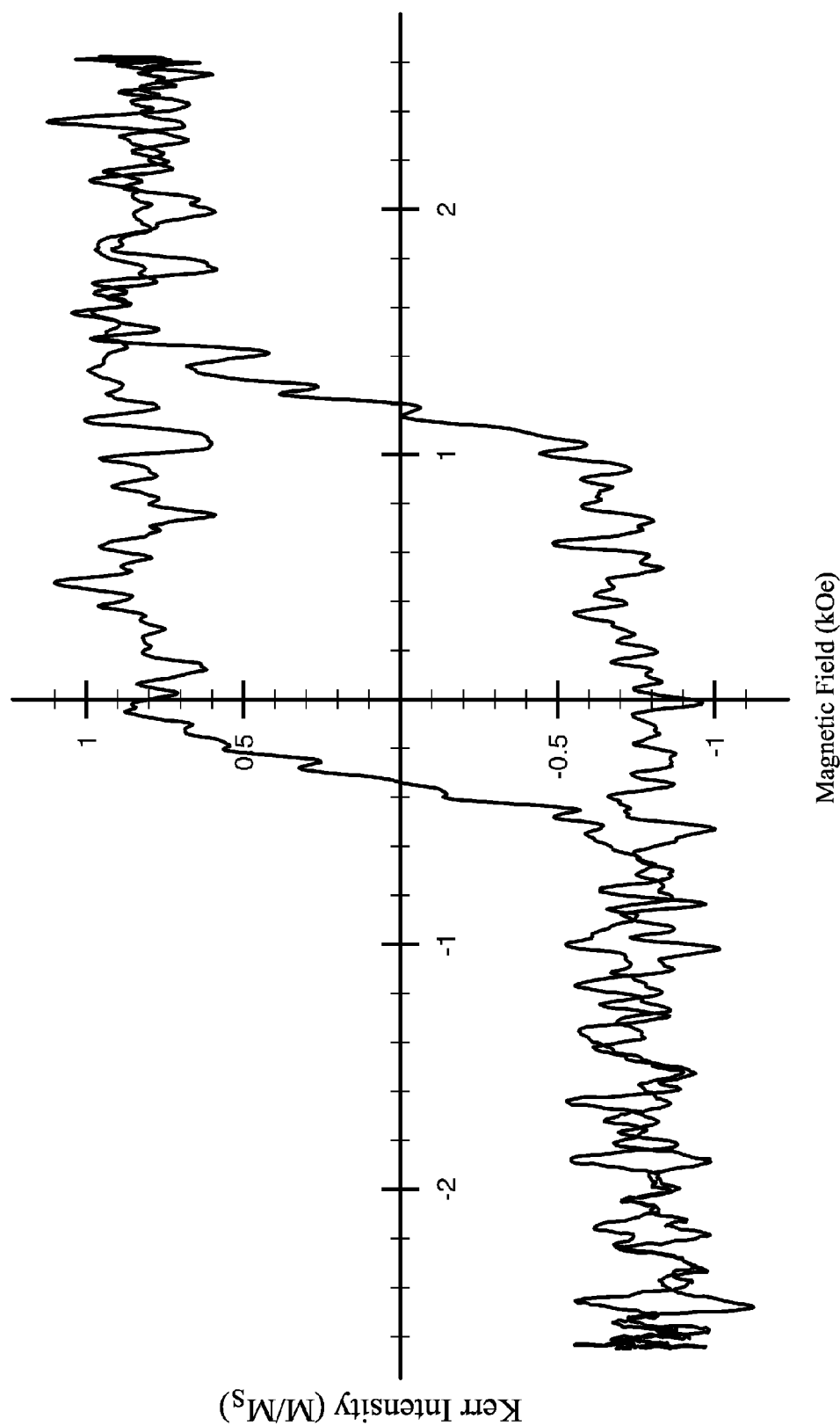
FIG. 14 is an out-of-plane hysteresis loop diagram of Comparative Example 2 when the electric pulse is in a positive direction.
Figure 15:
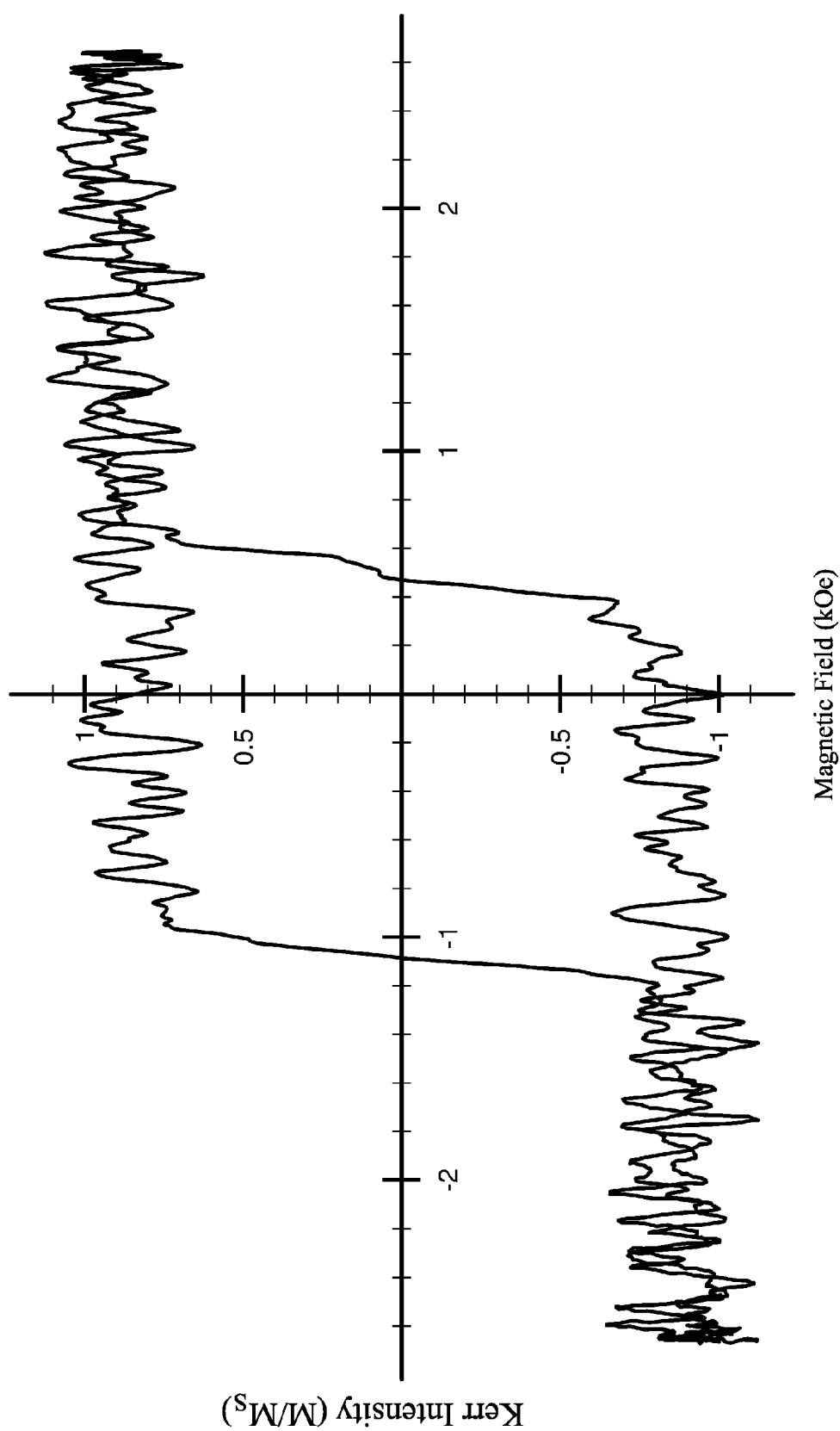
FIG. 15 is an out-of-plane hysteresis loop diagram of Comparative Example 2 when the electric pulse is in a negative direction.

The SOT memory cell 3 of Comparative Example 2 is similar to that of CE1, but differs in the thickness of the Co layer, i.e., the first metal layer 311. In other words, the overall structure of the SOT memory cell 3 of CE2 in the bottom-up direction is Ta(2.5 nm)/Pt(2 nm)/Co(0.88 nm)/$Ir_{20}Mn_{80}$(6 nm)/Pt(4 nm)/Ta(2.5 nm), where the magnetic free layer 31 of CE2 has the structure of Pt(2 nm)/Co(0.88 nm)/$Ir_{20}Mn_{80}$(6 nm). The result of Comparative Example 2 is shown in FIGS. 14 to 16.

[Data Analysis]

As shown in FIG. 4, the magnetic moments of the SOT memory cell 3 of CE1 can be reversed under an external in-plane magnetic field of 200 Oe and reaching critical current density ($J_c=\pm2.8\times10^7$ A/cm$^2$). However, as shown in FIG. 5, when the electric pulse is provided in the positive direction, the hysteresis loop shows that the exchange bias field ($H_{EB}$) of CE1 is only about 238 Oe ((|785+(−310))/2|≈238), but the coercive field ($H_c$) of CE1 is about 548 Oe (|(785−(−310))/2|≈548). As shown in FIG. 6, when the electric pulse is provided in the negative direction, the hysteresis loop shows that the exchange bias field ($H_{EB}$) of CE1 is only about 232 Oe ((|355+(−819))/2|≈232), but the coercive field ($H_c$) of CE1 is about 587 Oe (|(355−(−819))/2|≈587). It appears that the $Ir_{20}Mn_{80}$ layer of CE1 cannot provide sufficient exchange bias field ($H_{EB}$) for the magnetic free layer 31 because of its insufficient thickness (only 6 nm). As such, the stored data in the SOT memory cell 3 of CE1 may easily be affected by ambient environment, which may cause errors during the data reading process.

As shown in FIG. 7, the magnetic moments of the SOT memory cell 3 of E1 can be flipped under an external in-plane magnetic field of 200 Oe and critical current density ($J_c=\pm3.2\times10^7$ A/cm$^2$). As shown in FIG. 8, when the electric pulse is provided in the positive direction, the hysteresis loop shows that the exchange bias field ($H_{EB}$) of E1 reaches 520 Oe ((|860+(180))/2|≈520), and the coercive field ($H_c$) of E1 is only about 340 Oe (|(860−(180))/2|≈340). As shown in FIG. 9, when the electric pulse is provided in the negative direction, the hysteresis loop shows that the exchange bias field ($H_{EB}$) of E1 is about 520 Oe ((|860+(180))/2|≈520), and the coercive field ($H_c$) of E1 is only about 337 Oe (|(−183−(−857))/2|≈337). It appears that the $Ir_{20}Mn_{80}$ layer of E1 is able to provide sufficient exchange bias field ($H_{EB}$) for the magnetic free layer 31 because of its thickness (8 nm).

To discuss in further detail, one can easily recognize from FIG. 8 that a magnetic field of about ±1 kOe is required to flip the magnetic moments of the SOT memory cell 3 of E1, i.e., to change the magnetic states. That is to say, the SOT memory cell 3 of E1 is relatively stable and its logic level is not easy to be affected by the ambient environment. This can also be seen in FIG. 9. In addition, it is worth noting that, even when the magnetic moments of E1 are flipped due to ambient environmental factors such as thermal fluctuation, such flipping can be automatically reversed when the affecting factors no longer exist as shown in FIGS. 8 and 9. The SOT-MRAM of the present disclosure surely has excellent magnetic data stability compared to the conventional SOT-MRAMs.

Figure 10:
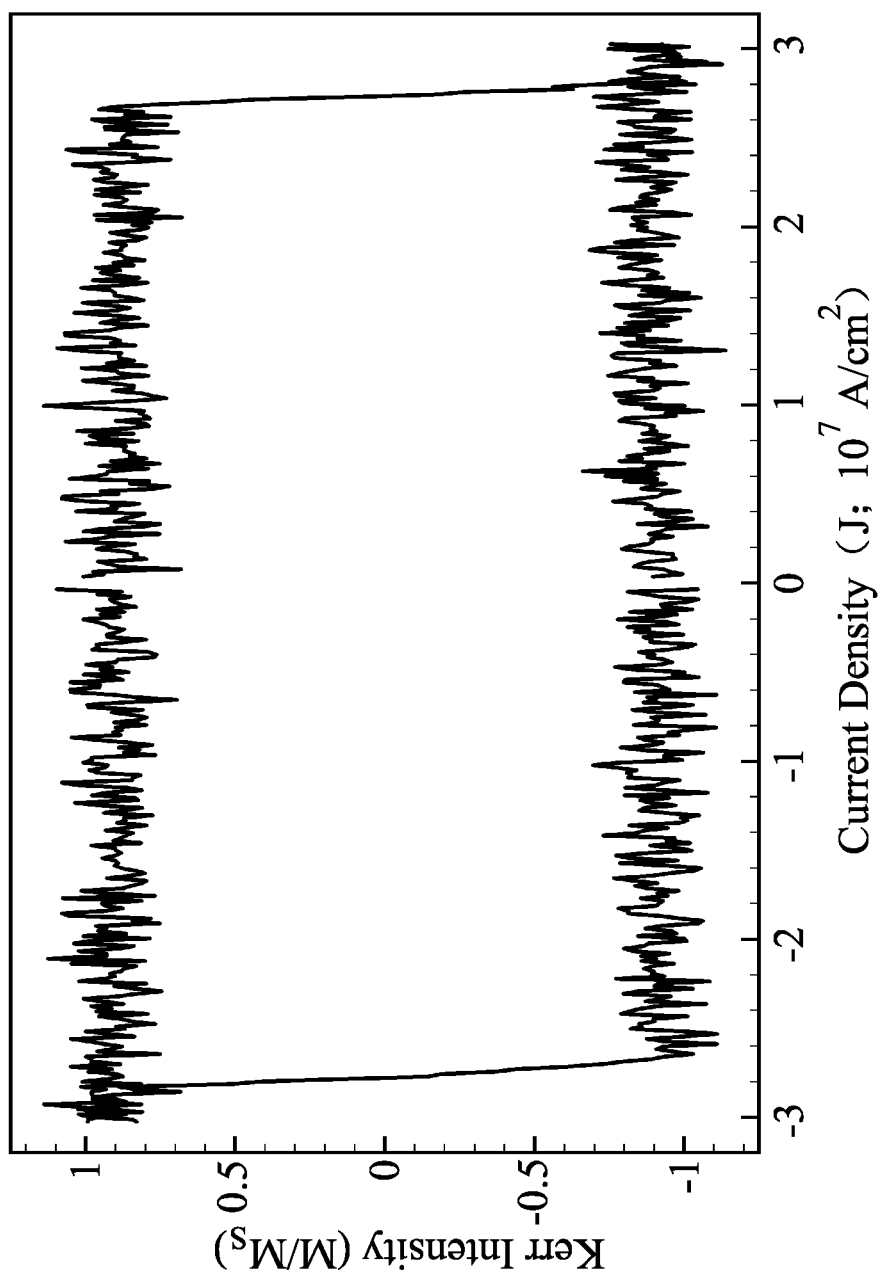
FIG. 10 is a graph illustrating the relationship between the Kerr Intensity and the current density for Example 2.
Figure 11:
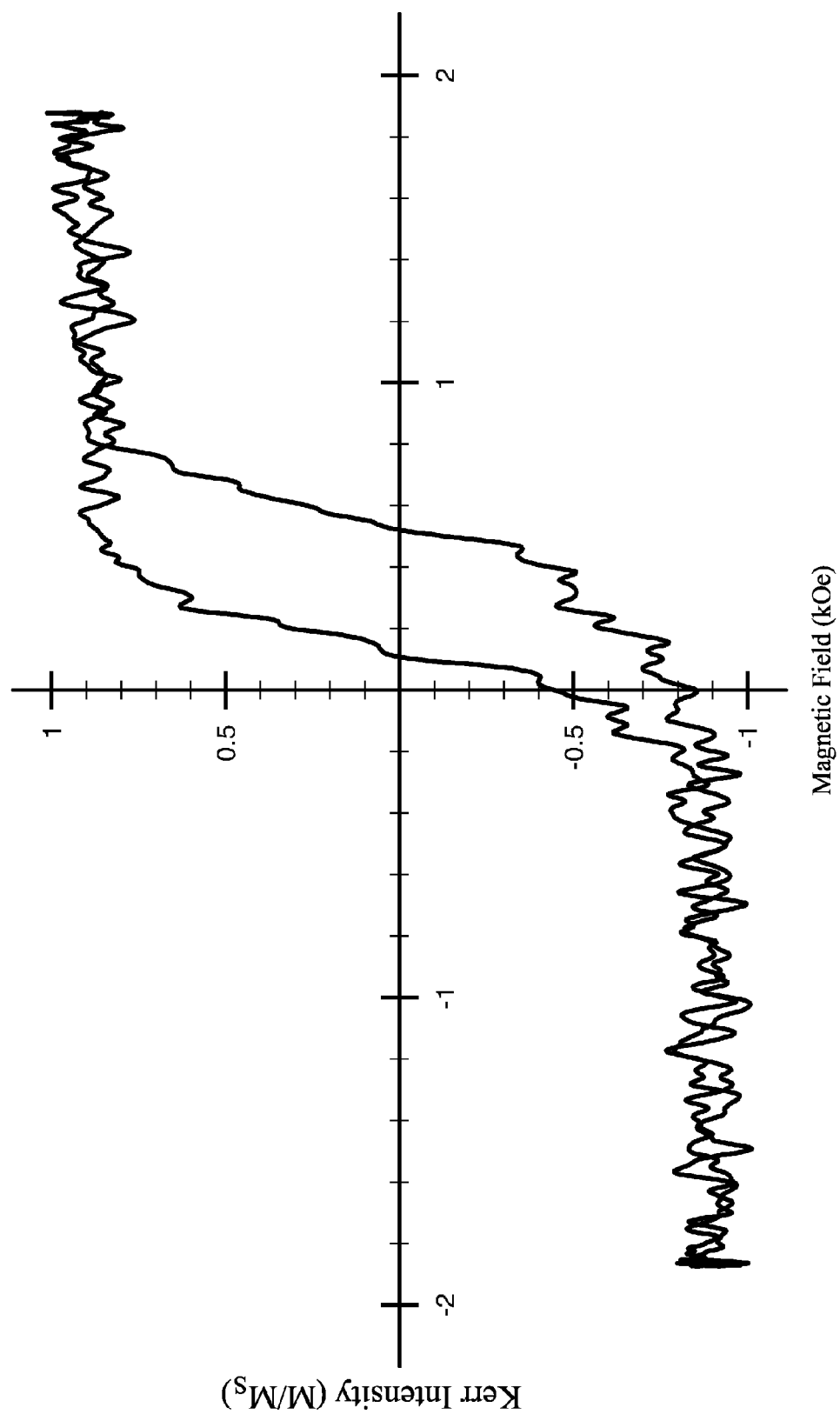
FIG. 11 is an out-of-plane hysteresis loop diagram of Example 2 when the electric pulse is in a positive direction.
Figure 12:
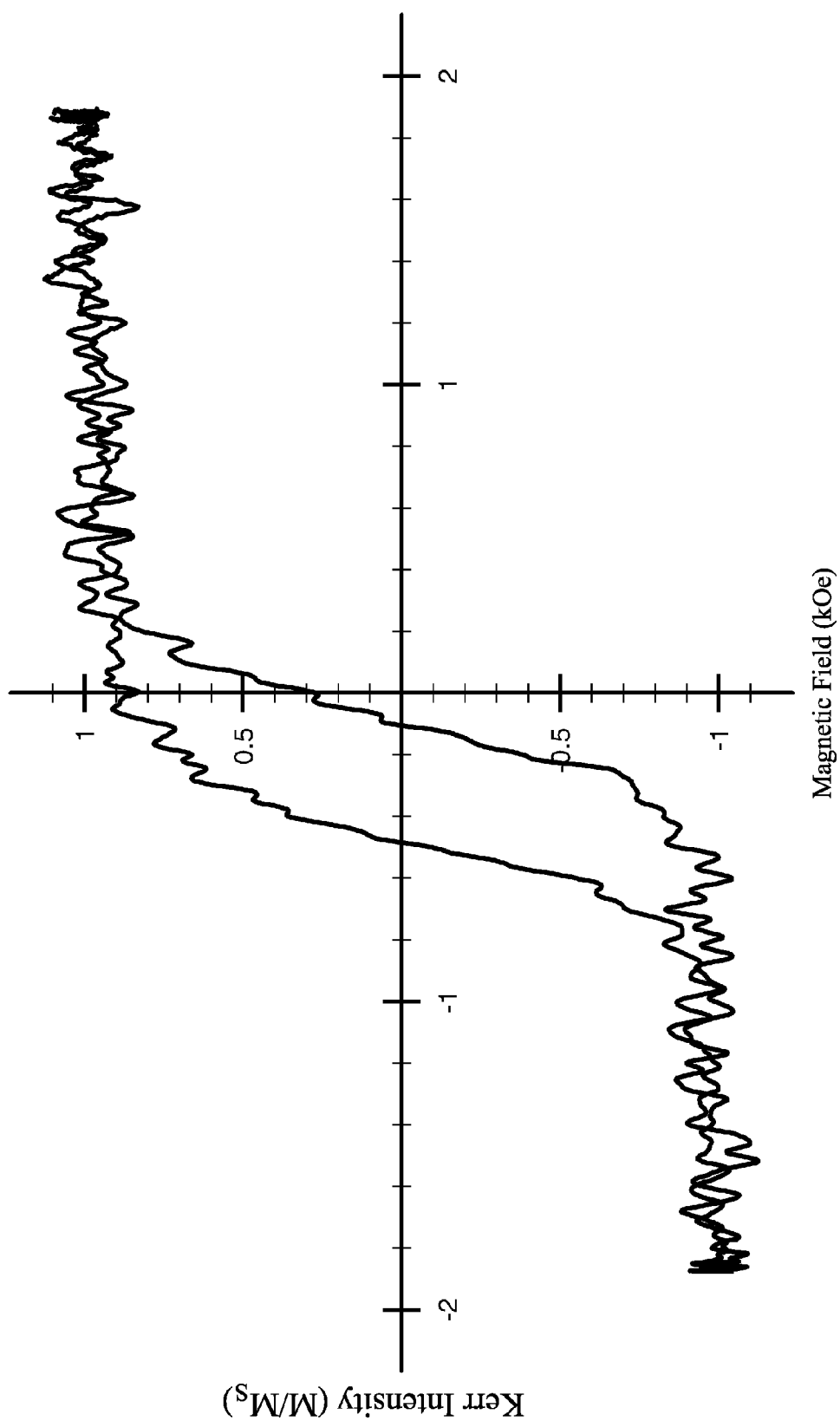
FIG. 12 is an out-of-plane hysteresis loop diagram of Example 2 when the electric pulse is in a negative direction.

As shown in FIG. 10, the magnetic moments of the SOT memory cell 3 of E2 can be reversed under an external in-plane magnetic field of 200 Oe reaching critical current density ($J_c=\pm2.9\times10^7$ A/cm$^2$). As shown in FIG. 11, when the electric pulse is provided in the positive direction, the hysteresis loop shows that the exchange bias field ($H_{EB}$) of E2 is about 300 Oe ((|500+100)/2|≈300), and the coercive field ($H_c$) of E2 is only about 200 Oe (|(500−(100))/2|≈200). As shown in FIG. 12, when the electric pulse is provided in the negative direction, the hysteresis loop shows that the exchange bias field ($H_{EB}$) of E2 is about 295 Oe ((|−(101)+(−489))/2|≈295), and the coercive field ($H_c$) of E2 is only about 194 Oe (|(−101−(−489))/2|≈194). It appears that the $Ir_{20}Mn_{80}$ layer of E2 is able to provide sufficient exchange bias field ($H_{EB}$) for the magnetic free layer 31 because of its thickness (10 nm).

To discuss in further detail, one can easily recognize from FIG. 11 that a magnetic field of about ±0.9 kOe is required to flip the magnetic moments of the SOT memory cell 3 of E2, i.e., to change the magnetic states. That is to say, the SOT memory cell 3 of E2 is relatively stable and its logic level is not easy to be affected by the ambient environment. This can also be seen in FIG. 12.

Figure 13:
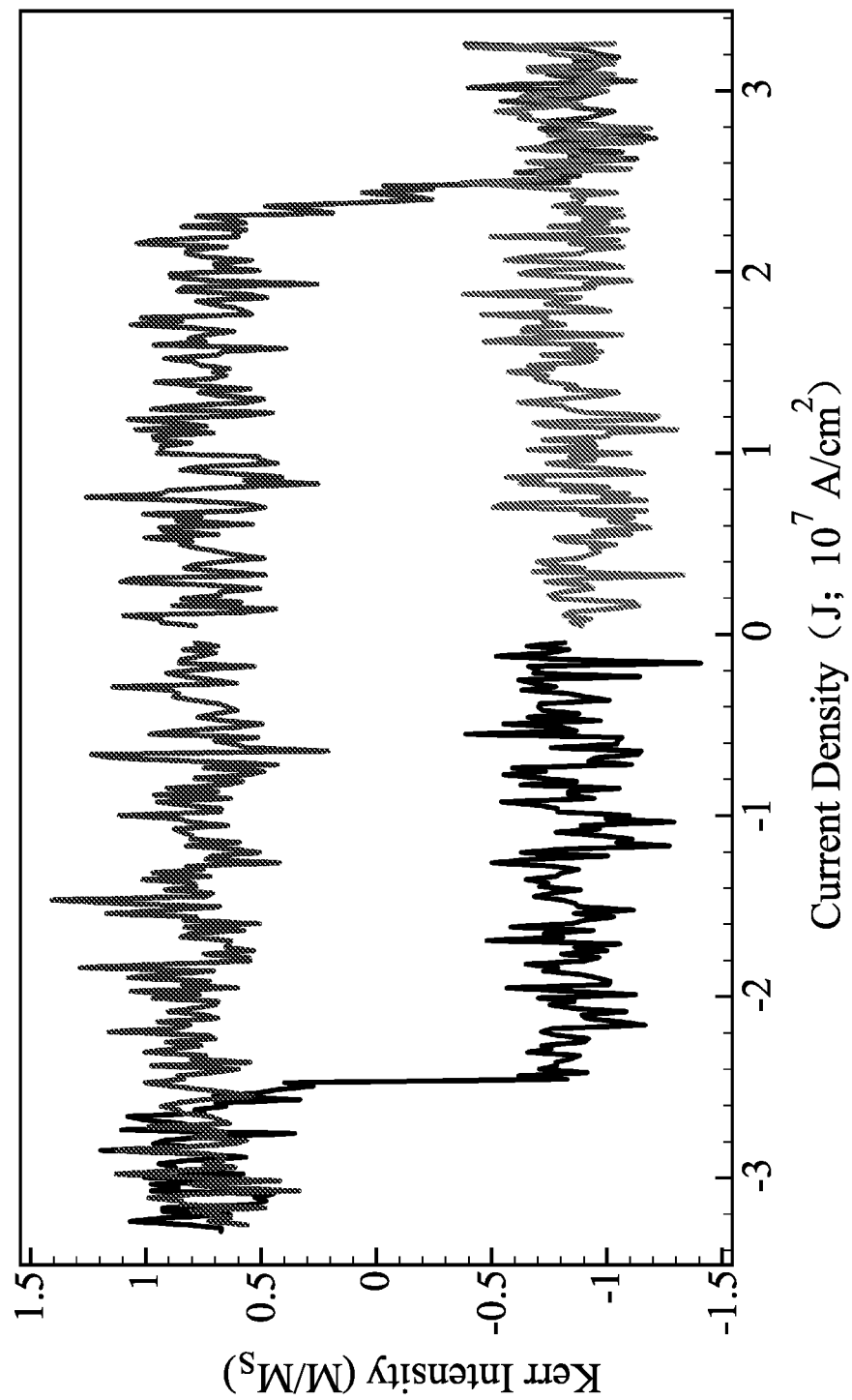
FIG. 13 is a graph illustrating the relationship between the Kerr Intensity and the current density for Comparative Example 2.

As shown in FIG. 13, the magnetic moments of the SOT memory cell 3 of CE2 can be reversed under an external in-plane magnetic field of 600 Oe and critical current density ($J_c=\pm2.6\times10^7$ A/cm$^2$). However, as shown in FIG. 14, when the electric pulse is provided in the positive direction, the hysteresis loop shows that the exchange bias field ($H_{EB}$) of CE2 is only about 425 Oe ((|1200+(−350))/2|≈425), but the coercive field ($H_c$) of CE2 is about 775 Oe (|(1200−(−350))/2|≈775). As shown in FIG. 15, when the electric pulse is provided in the negative direction, the hysteresis loop shows that the exchange bias field ($H_{EB}$) of CE2 is only about 301 Oe ((|479+(−1080))/2|≈301), but the coercive field ($H_c$) of CE2 is about 780 Oe (|(479−(−1080))/2|≈780). It appears that the $Ir_{20}Mn_{80}$ layer of CE2 cannot provide sufficient exchange bias field ($H_{EB}$) for the magnetic free layer 31 because of its insufficient thickness (only 6 nm). As such, the stored data in the SOT memory cell 3 of CE2 may easily be affected by ambient environment, which may cause errors during the data reading process.

As shown in FIG. 16, the magnetic moments of the SOT memory cell 3 of E3 can be reversed under an external in-plane magnetic field of 600 Oe and critical current density ($J_c$=2.6×10 A/cm$^2$ and −3.0×10 A/cm$^2$). As shown in FIG. 17, when the electric pulse is provided in the positive direction, the hysteresis loop shows that the exchange bias field ($H_{EB}$) of E3 is about 773 Oe ((|1258+288)/2|≈773), and the coercive field ($H_c$) of E3 is only about 485 Oe (|(1258−288)/2|≈485). As shown in FIG. 18, when the electric pulse is provided in the negative direction, the hysteresis loop shows that the exchange bias field ($H_{EB}$) of E3 is about 522 Oe (|(−(42)+(−1002))/2|≈522), and the coercive field ($H_c$) of E3 is only about 480 Oe (|(−42−(−1002))/2|≈480). It appears that the $Ir_{20}Mn_{80}$ layer of E3 is able to provide sufficient exchange bias field ($H_{EB}$) for the magnetic free layer 31 because of its thickness (8 nm).

To discuss in further detail, one can easily recognize from FIG. 17 that a magnetic field of about +1.4 kOe (or −1.2 kOe) is required to flip the magnetic moments of the SOT memory cell 3 of E3, i.e., to change the magnetic states. That is to say, the SOT memory cell 3 of E3 is relatively stable and its logic level is not easy to be affected by the ambient environment. This can also be seen in FIG. 18.

In summary, the configuration of the SOT memory cell 3, e.g., the first metal layer 311 having its thickness ($d_1$) ranging from 0.5 nm to 1.5 nm and exhibiting perpendicular magnetic anisotropy, and the second metal layer 312 having the thickness ($d_2$) greater than 6 nm and exhibiting no perpendicular magnetic anisotropy, etc., allows the SOT-MRAM of the present disclosure to have $|H_{EB}|>|H_c|$. As such, the SOT-MRAM of the present disclosure exhibits prominent thermal stability while maintaining its simple structure compared with the conventional SOT-MRAMs.

In the description above, for the purposes of explanation, numerous specific details have been set forth in order to provide a thorough understanding of the embodiment(s). It will be apparent, however, to one skilled in the art, that one or more other embodiments maybe practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A spin-orbit torque magnetic random access memory, comprising:
   a substrate;
   an SOT memory cell disposed on the substrate and including a magnetic free layer, wherein the magnetic free layer includes a ferromagnetic first metal layer, an anti-ferromagnetic second metal layer contacting the first metal layer, and a third metal layer contacting the first metal layer for generating the spin-Hall effect,
   wherein the first metal layer has a thickness ranging from 0.5 nm to 1.5 nm and exhibits perpendicular magnetic anisotropy,
   wherein the second metal layer has a thickness of greater than 6 nm for providing an exchange bias field upon an external magnetic field and an electric pulse being provided along a hard axis of the first metal layer reaching a critical current density,
   wherein the second metal layer is an IrMn layer which is not undergone out-of-plane magnetic annealing or out-of-plane magnetic coating and exhibits no perpendicular magnetic anisotropy,
   wherein the magnetic free layer has a coercive magnetic field upon reaching the critical current density, and $|H_{EB}|>|H_c|$.

2. The SOT-MRAM of claim 1, wherein the thickness of the first metal layer is greater than or equal to 0.8 nm and less than 1.2 nm, and the thickness of the second metal layer is greater than or equal to 8 nm and less than 15 nm.

3. The SOT-MRAM of claim 2, wherein:
   the first metal layer includes a first metal selected from the group consisting of Co, Fe, Ni, and combinations thereof;
   the third metal layer includes a second metal, or a third metal doped with a fourth metal;
   the second metal is selected from the group consisting of Pd, Pt, Ta, Mo, W, and combinations thereof;
   the third metal is selected from the group consisting of Cu, Pt, W and combinations thereof; and
   the fourth metal is selected from the group consisting of Ir, Pt, W, Bi and combinations thereof.

4. The SOT-MRAM of claim 3, wherein the first metal layer is made of Co, and the third metal layer is made of Pt.

5. The SOT-MRAM of claim 4, wherein the third metal layer has a thickness greater than or equal to 1.5 nm and less than or equal to 8 nm.

6. The SOT-MRAM of claim 5, wherein the thickness of the third metal layer is greater than or equal to 1.5 nm and less than or equal to 3.0 nm.

* * * * *